(12) United States Patent
Mathis et al.

(10) Patent No.: US 10,114,045 B2
(45) Date of Patent: Oct. 30, 2018

(54) METER AND METHOD FOR DETERMINING METER READINGS AND METHOD FOR THE WIRELESS TRANSMISSION OF ELECTRICAL ENERGY

(71) Applicant: GWF MESSSYSTEME AG, Lucerne (CH)

(72) Inventors: Peter Mathis, Stansstad (CH); Roland Mettler, Lucerne (CH); Markus Helfenstein, Lucerne (CH)

(73) Assignee: GWF MESSSYSTEME AG, Lucerne (CH)

( * ) Notice: Subject to any disclaimer, the term of this patent is extended or adjusted under 35 U.S.C. 154(b) by 0 days.

(21) Appl. No.: 15/533,192

(22) PCT Filed: Dec. 2, 2015

(86) PCT No.: PCT/EP2015/078429
§ 371 (c)(1),
(2) Date: Jun. 5, 2017

(87) PCT Pub. No.: WO2016/087553
PCT Pub. Date: Jun. 9, 2016

(65) Prior Publication Data
US 2017/0328938 A1    Nov. 16, 2017

(30) Foreign Application Priority Data

Dec. 4, 2014 (EP) .................................... 14196248

(51) Int. Cl.
*G08B 23/00* (2006.01)
*G08C 15/06* (2006.01)
*G01R 15/26* (2006.01)

(52) U.S. Cl.
CPC .................................... *G01R 15/26* (2013.01)

(58) Field of Classification Search
CPC ...................................................... G01R 15/26
(Continued)

(56) References Cited

U.S. PATENT DOCUMENTS 4,457,014 A * 6/1984 Bloy .................... H03G 3/3005
381/106
6,012,339 A * 1/2000 Genack .................. G01F 1/075
73/861.77

(Continued)

FOREIGN PATENT DOCUMENTS

CN       202331785 U     7/2012
CN       202889340 U     4/2013
(Continued)

*Primary Examiner* — Tanmay Shah
(74) *Attorney, Agent, or Firm* — William J. Clemens; Shumaker, Loop & Kendrick, LLP

(57) ABSTRACT

A meter includes a hermetically encapsulated electronic metering mechanism having a meter unit for the determination of meter readings, the metering mechanism including a data memory for storing the meter readings, and the metering unit including an antenna of a defined shape, and a readout unit arranged outside the metering mechanism for reading the meter readings from the data memory. The meter is operated according to a method for the determination of meter readings and for the wireless transmission of electrical energy. The shape of the readout unit antenna is identical to the shape of the metering unit antenna, wherein the congruent and predefined positioning of the readout unit antenna ensures an effective wireless energy supply to the metering unit by electromagnetic radiation through the readout unit, and, independently thereof, a stable wireless data coupling for the determination of meter readings between the metering unit and the readout unit.

18 Claims, 5 Drawing Sheets

(58) Field of Classification Search
USPC .................................................. 340/870.02
See application file for complete search history.

(56) References Cited

U.S. PATENT DOCUMENTS

| | | | |
|---|---|---|---|
| 7,126,493 | B2 | 10/2006 | Junker et al. |
| 7,248,181 | B2 | 7/2007 | Patterson et al. |
| 2008/0036588 | A1 | 2/2008 | Iverson et al. |
| 2010/0057296 | A1 | 3/2010 | Ryman |
| 2012/0098710 | A1* | 4/2012 | Seal .................. H01Q 9/16 343/702 |
| 2012/0274478 | A1* | 11/2012 | Stenson ............. G01F 15/063 340/870.02 |
| 2014/0045550 | A1 | 2/2014 | Rosenberg et al. |

FOREIGN PATENT DOCUMENTS

| | | |
|---|---|---|
| CN | 202929746 U | 5/2013 |
| CN | 202929747 U | 5/2013 |
| CN | 202929749 U | 5/2013 |
| CN | 202996002 U | 6/2013 |
| CN | 103258414 A | 8/2013 |
| CN | 203149818 U | 8/2013 |
| CN | 203149819 U | 8/2013 |
| CN | 203192220 U | 9/2013 |
| CN | 203242151 U | 10/2013 |
| DE | 3804592 C1 | 8/1989 |
| GB | 2308947 A | 7/1997 |
| JP | 2008015855 A | 1/2008 |
| JP | 2014138273 A | 7/2014 |
| WO | 2013086684 A1 | 6/2013 |
| WO | 2014004678 A1 | 1/2014 |

\* cited by examiner

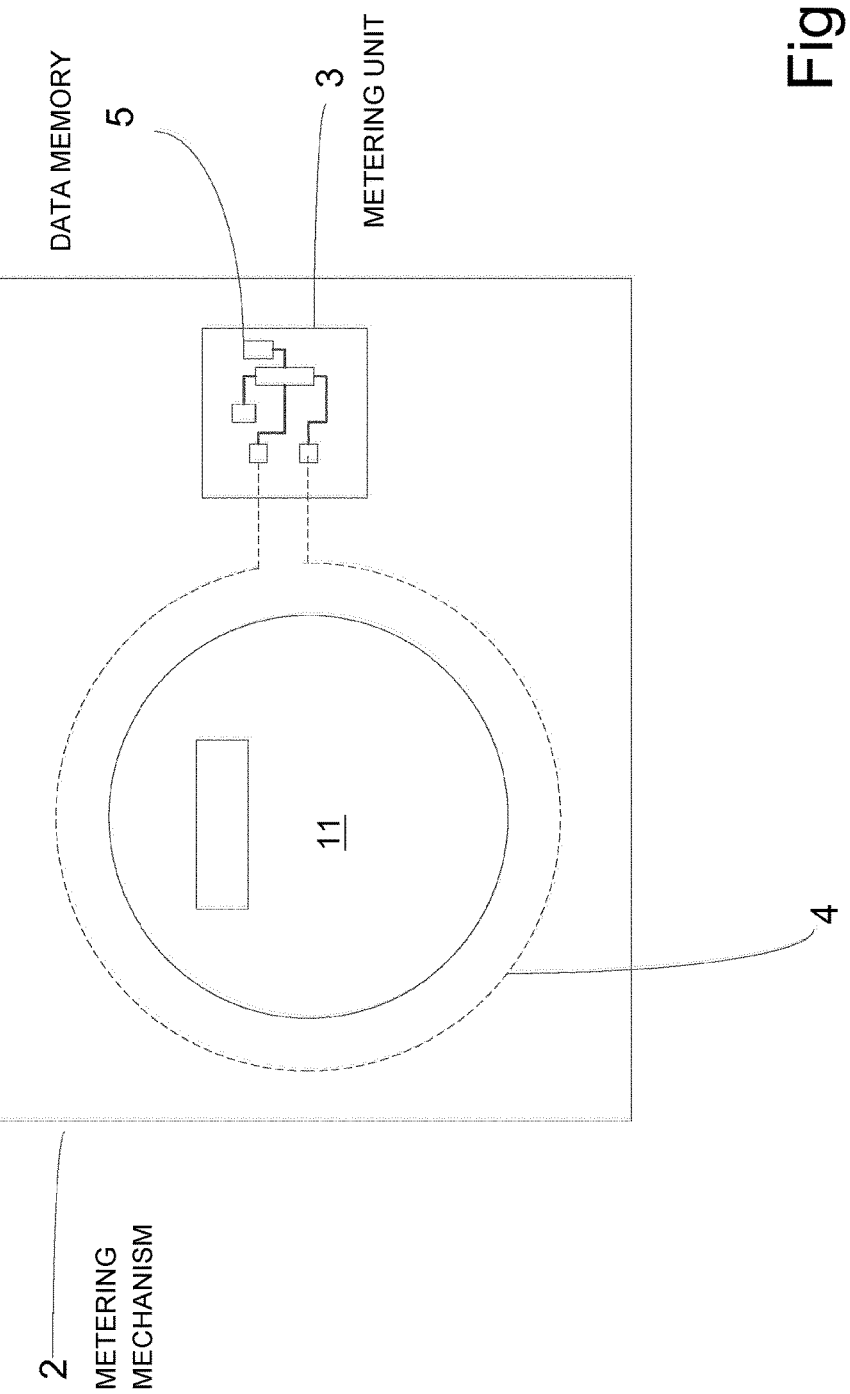

METER AND METHOD FOR DETERMINING METER READINGS AND METHOD FOR THE WIRELESS TRANSMISSION OF ELECTRICAL ENERGY

FIELD

The invention pertains to a meter that comprises a hermetically encapsulated electronic metering mechanism with at least one metering unit for the determination of meter readings, wherein the hermetically encapsulated electronic metering mechanism comprises a data memory for storing the meter readings, wherein at least one metering unit comprises an antenna with a defined antenna shape, and wherein at least one readout unit for reading out the meter readings from the data memory can be arranged outside the hermetically encapsulated electronic metering mechanism. The invention also pertains to a method for the determination of meter readings of a hermetically encapsulated meter with an electronic metering mechanism, a metering unit and a data memory for storing the meter readings, wherein the metering unit comprises an antenna with a defined antenna shape. The invention furthermore pertains to a method for the wireless transmission of electrical energy to a hermetically encapsulated meter with an electronic metering mechanism and a metering unit by means of electromagnetic radiation, wherein the metering unit comprises an antenna with a defined antenna shape.

BACKGROUND

Meters for fluidic resources such as, for example, water and gas meters are frequently arranged in the immediate vicinity of the supply systems for the fluidic resources and therefore directly exposed to adverse external conditions such as moisture, dirt and temperature fluctuations. In the past, reliable and cost-efficient mechanical metering mechanisms, which were able to ensure a long service life, were frequently used in such meters, particularly in water meters, in order to protect against these adverse ambient conditions. However, mechanical metering mechanisms have the disadvantage that the readout of the meter readings typically has to be carried out visually by a person at the installation site of the meter and therefore is labor and cost-intensive.

Consequently, various electronic meters, which are connected to a network, are nowadays used such that the readout of the digital meter readings of the meters can be realized by a central database via the network. These network-bound applications frequently are also collectively referred to as "Smart Metering."

In order to ensure the functionality of the electronic meters, the electronic meters not only require an energy supply, but the meters also have to be connected to the network by means of suitable and reliable interfaces in order to transmit the meter data. In the prior art, the energy supply was either realized by means of an internal power source such as a battery or by means of a permanent electrical power supply as described, for example, in EP0293639 A2.

If an internal power source such as a battery is used for the electronic metering mechanism, the service life of the electronic meter is primarily defined by the service life of the internal battery. In order to protect the power source from environmental influences, the power source and the electronic metering mechanism usually are hermetically encapsulated such that the power source cannot be readily exchanged, wherein meters with a power source in the form of an internal battery are therefore only used to a limited extent. If the energy supply and the data link are respectively realized by means of electrical power and data cables, sealing problems frequently arise within the cable leadthroughs due to aging processes and fatigue of the materials used, particularly the sealing material.

In addition, there also exist alternative meters with radio applications, by means of which at least a wireless data transmission from the hermetically encapsulated metering mechanism to a readout device arranged outside the metering mechanism can be achieved. However, the electrical energy supply for such meters with radio applications is frequently still realized with internal power sources such as batteries and wire-bound cable connections as described, for example, in US 2014/0045550 A1.

Furthermore, there also exist completely wireless energy supply and data transmission systems for meters such as, for example, Radio Frequency Identification—or RFID—applications. In this case, an RFID transponder is integrated into the hermetically encapsulated metering mechanism of the meter, wherein the RFID transponder features an antenna, an analog receiving and transmitting circuit, as well as a digital circuit and a non-volatile memory. The readout device assigned to the RFID transponder generates a high-frequency electromagnetic alternating field that is picked up by the antenna of the RFID transponder and activates the electronics of the RFID transponder in accordance with the meanwhile standardized RFID method. In this case, the readout device simultaneously sends communication and control commands that are picked up and additionally processed by the RFID transponder. The detection of the respective RFID transponder in the readout device is ensured, for example, in that the RFID transponder encodes the signal response to the readout device and models the electromagnetic field in the irradiated electromagnetic field of the readout device by means of field shunting or anti-phase reflection in order to thereby transmit its own unchangeable serial number, additional data and other information requested by the readout device. After the data transmission from the RFID transponder to the readout device, the data link between the RFID transponder and the readout device is once again separated by means of a standardized method and the energy transmission from the readout device is subsequently interrupted.

For example, JP2008015855A describes an RFID transponder system for a meter with communication functions, wherein a wireless and reliable data transmission from the meter to the readout device is ensured by purposefully controlling the transmission rate of the meter.

In conventional RFID transponder systems, however, it is problematic that a circular polarization of the high-frequency electromagnetic alternating field is frequently required due to different positioning of the readout device relative to the RFID transponder, wherein such a circular polarization requires high radiation energy of the electromagnetic alternating field and results in a long energy transmission and data link period. Furthermore, the fluidic resources, particularly water, absorb the radiation energy of the electromagnetic alternating field and an additional reflection of the electromagnetic alternating field takes place on the usually metallic components of the meter such that only a fraction of the radiation energy of the electromagnetic alternating field reaches the readout device of the RFID transponder. Consequently, high radiation energies of the electromagnetic alternating field emitted by the readout device are required for the energy transmission to the RFID transponder, as well as the data link therewith. Even if the electromagnetic alternating field emitted by the readout device has a very high radiation energy, the wireless energy transmission or the subsequently established data link may still be faulty if the readout device is unfavorably or variably positioned relative to the RFID transponder such that the connection and therefore the time-intensive data link between the readout device and the RFID transponder in accordance with the RFID standard have to be established anew.

Another disadvantage of solutions known from the prior art can be seen in that previous cable-bound or wireless meter systems cannot simultaneously ensure an effective energy supply for the hermetically encapsulated meter and a reliable and stable data link between the readout device and the hermetically encapsulated meter. One particular disadvantage of RFID transponder systems in meters can be seen in that the energy supply of the RFID transponder can only be realized with very high radiation energies of the electromagnetic alternating field emitted by the readout device, which in turn leads to a high power consumption of the readout devices. The energy and data link has to be established anew very frequently due to inaccurate or variable positioning of the readout device relative to the RFID transponder such that the power consumption of the readout device is additionally increased and the readout of the data from the RFID transponder is respectively delayed or prevented.

SUMMARY

The invention is therefore based on the an objective of eliminating the disadvantages of the prior art and making available a meter that provides an effective and stable energy supply for a hermetically encapsulated electronic metering mechanism while a data link is established between the hermetically encapsulated electronic metering mechanism and an external readout device and ensures a reliable and stable data link.

This objective is attained by means of the meter with a hermetically encapsulated electronic metering mechanism, the method for the determination of meter readings and the method for the wireless transmission of electrical energy by means of electromagnetic radiation.

The invention proposes a meter comprising a hermetically encapsulated electronic metering mechanism with at least one metering unit for the determination of meter readings, wherein the hermetically encapsulated electronic metering mechanism comprises a data memory for storing the meter readings, and wherein the metering unit comprises an antenna with a defined antenna shape. In the context of the present invention, the term electronic metering mechanism includes a mechanical metering mechanism with readout electronics or a fully electronic meter. Furthermore, the term data refers in the context of the present invention to current or past meter readings, identification information of the meter, the metering unit and/or the readout unit and/or information on operating states of the meter, the metering unit and/or the readout unit. The invention furthermore proposes a readout unit for reading out the meter readings from the data memory, wherein said readout unit is arranged outside the hermetically encapsulated electronic metering mechanism and features an antenna with an antenna shape corresponding to the antenna shape of the antenna of the metering unit. The readout unit may either be permanently or temporarily connected to the metering unit, for example permanently on the meter or temporarily in the form of a handheld readout device that is briefly connected to the metering unit. The readout unit and the metering unit can be positioned relative to one another in such a way that the antenna of the readout unit and the antenna of the metering unit are arranged congruent with one another. Due to the identical antenna shapes of the metering unit and the readout unit and the congruent arrangement of the antennas of the readout unit and the metering unit relative to one another, the present invention makes it possible to achieve a very effective energy transmission from the readout unit to the metering unit. An effective and stable data link between the metering unit and the readout unit can also be realized after the initial wireless electrical energy supply of the metering unit by the readout unit due to the identical antenna shapes of the readout unit and the metering unit, as well as the congruent arrangement of the antennas of the readout unit and the metering unit, such that the required external energy supply of the metering unit is limited to the absolutely necessary minimum. This inventive design of the meter also makes it possible to use readout units with a significantly lower transmitting power than conventional RFID readers.

In order to achieve an efficient energy transmission from the readout unit to the metering unit, the aforementioned congruently arranged antennas are preferably positioned or in the installed state arranged in the meter in such a way that the antennas lie on top of one another, wherein the antennas overlap one another.

In the context of the present invention, the term congruent refers to a consistent spacing between the antenna of the metering unit and the antenna of the readout unit in a multitude of points thereof. In a congruent arrangement of the antennas, the effective transmitting surface of the antenna shape of the readout unit and the effective surface of the antenna shape of the metering unit particularly are arranged congruently and in parallel planes at a short distance from one another. For example, a circular round antenna of the metering unit may be turned relative to an identical circular round antenna of the readout unit about the same center in the assigned parallel plane, wherein the congruence between the effective transmitting surface of the antenna of the readout unit and the effective surface of the antenna of the metering unit particularly does not change in this case. In the context of the invention, the metering unit may be respectively connected to several readout units simultaneously or individually and separately. Electrical energy is advantageously transmitted from the readout unit to the metering unit in a wireless fashion, wherein the electrical energy can be transmitted from the antenna of the readout unit to the corresponding antenna of the metering unit in the form of electromagnetic radiation. The concept of the present invention also includes alternative energy transmission mechanisms that utilize the antenna shapes and the relative arrangement between the antennas of the readout unit and the metering unit such as, for example, a capacitive coupling. However, the utilization of an internal power source such as a battery or a capacitor within the hermetically encapsulated metering mechanism, as well as other known methods for the electrical energy supply of the meter, may likewise be implemented in the meter system according to the present invention.

Although the utilization of corresponding antenna shapes of the readout unit and the metering unit and their congruent arrangement relative to one another are particularly advantageous for a wireless energy supply of the metering unit by the readout unit and the simultaneous wireless data link between the metering unit and the readout unit, their respective sole utilization for the exclusive purpose of the wireless energy supply of the metering unit or a separate data link between the metering unit and the readout unit is explicitly also possible and advantageous in the context of the invention. For example, the utilization of a battery, a storage battery and/or merely a capacitor as internal power source of the metering unit may be practical based on certain ambient conditions such that the congruent arrangement of the corresponding antennas of the metering unit and the readout unit is exclusively used for the data link and the data transmission. In this application, the internal power source in the metering unit can likewise be charged by means of the wireless energy transmission of the readout unit.

The antennas of the readout unit and the metering unit may be respectively formed by a closed annular body.

An advantage is seen in that the antenna shape of the readout unit and the corresponding antenna shape of the metering unit are at least sectionally circular and the respective circular sections of the aforementioned antennas have the same curvature radius or that the aforementioned antennas are respectively realized in the form of circle segments. For example, the antennas realized in the form of circle segments may consist or be composed of a circular arc section and a chord section. Another advantage is seen in that the antenna of the readout unit is integrated into the housing of the readout unit and the corresponding antenna of the metering unit is integrated into the housing of the metering unit, and that the readout unit and the metering unit can be positioned relative to one another by means of a coupling element. In the case of a congruent arrangement of circular antenna shapes of the metering unit and the readout unit, a high congruence between the effective transmitting surface of the readout unit and the effective surface of the metering unit can be realized such that an efficiency of the wireless energy transmission in excess of 90% can be achieved. The inventive concept also includes other antenna shapes, particularly rectangular designs. The antenna may likewise only utilize part of the glass circumference or be positioned at a different location. In a plastic housing, it is particularly possible to position an arbitrary antenna shape at a suitable location. Since the respective antennas are rigidly embedded in the housings of the readout unit and the metering unit, the readout unit and the metering unit can be positioned relative to one another in such a way that the integrated antennas are arranged congruent with one another. The antennas are preferably spaced apart from one another by a distance between 2 mm and 10 mm because a very effective wireless energy supply and/or stable wireless data link particularly can be realized if the congruently arranged antennas of the metering unit and the readout unit are spaced apart by short distances. However, coupling elements on the readout unit and on the metering unit may also be used for this purpose such that the readout unit and the metering unit respectively can only be connected to one another in an exactly defined position, for example by means of a snap-type coupling or a screw thread.

In another advantageous embodiment of the invention, the readout unit can be directly connected to the meter and therefore to the metering unit. In this case, the readout unit may be respectively connected to the metering unit or to the meter either permanently or temporarily in the form of a handheld readout unit. If circular antenna shapes are used, the diameter of the circular antennas can be adapted to the diameter of the usually also circular viewing glass of the meter. In this way, the circular antenna of the metering unit can be arranged within the hermetically encapsulated metering unit underneath the viewing glass and the identical circular antenna of the readout unit can be positioned above the circular viewing glass and, if applicable, integrated into the mounting of the viewing glass. Due to this meter design, it is not only possible to realize a direct visual readout of the meter readings through the viewing glass, but also an effective wireless energy supply and data link between the readout unit above the viewing glass and the metering unit underneath the viewing glass in the hermetically encapsulated metering mechanism.

An advantage with respect to the data link mechanism is seen in that data can be transmitted from the data memory of the metering unit to the readout unit, wherein the data can be transmitted from the antenna of the metering unit to the corresponding antenna of the readout unit by means of a capacitive and/or inductive coupling. This capacitive and/or inductive coupling not only makes it possible to transmit data from the metering unit to the readout unit, but also to transmit control commands, information or configuration data files from the readout unit to the metering unit and therefore to additionally process and store these control commands, information or configuration data files in the metering unit. The various capacitive and/or inductive coupling methods allow different data transmission rates and connection stabilities of the wireless data link and data transmission between the metering unit and the readout unit with consideration of the frequency bands of the carrier wave. In the context of the invention, an encrypted data transmission can also be ensured with a capacitive and/or inductive data link, if applicable, by incorporating other data processing devices and network connections. In addition, the utilization of conventional connection protocols and data flow control methods between the metering unit and the readout unit such as, for example, the utilization of IP addresses as network protocols for the metering unit or a so-called handshake method for adapting the data transmission rate between the metering unit and the readout unit can also be implemented by means of a capacitive and/or inductive data link.

An advantage of the present invention is seen in that the data can be transmitted from the data memory of the metering unit to the readout unit digitally and with a reduced data volume in comparison with a standardized data set. The standardized data sets and data protocols according to established technical norms such as, for example, the M-Bus Open Metering System usually require the transmission of a multitude of data from the metering unit to the readout unit such that various applications and various data combinations are covered by the technical norms. However, the complete transmission of all data required in the respective technical norm is not necessary in a large number of applications, particularly standard applications. In this respect, the inventive meter concept is also characterized in that data can be transmitted with a reduced data volume in comparison with a standardized data set of a technical norm or technical standard. In order to keep the data transmission period as short as possible on the one hand, but to allow the additional processing of the data from the metering unit in accordance with established technical norms and standards on the other hand, the present invention proposes that the readout unit allocates the data, which is reduced in comparison with the standardized data set, to the standardized data set by means of an allocator function and thereby completes the standardized data set. In this way, the data transmission from the metering unit to the readout unit can be realized with a reduced data set in comparison with the standard and data processing according to the technical norm or standard can simultaneously be ensured in the readout unit due to the completion of the data into the required standard data set of the respectively applicable technical norm or standard.

In order to accelerate the readout from the metering unit, it is furthermore advantageous that the data memory of the metering unit features a main memory and a buffer memory and the data can be synchronized between the main memory and the buffer memory when electrical energy is available, wherein the data in the buffer memory can be read out and transmitted as part of the data transmission between the metering unit and the readout unit. Popular RFID memory architectures frequently utilized non-volatile Electrically Erasable and Programmable Read-Only Memories (EE-PROMs), but these memories have slow access times and only a limited service life such that their utilization as a data memory in a hermetically encapsulated metering mechanism is limited. According to the invention, it is therefore proposed that the data is stored in a Random Access Memory (RAM) such as, for example, a Ferroelectric Random Access Memory (FRAM) or Static Random Access Memory (SRAM), the storage properties of which can be varied by purposefully changing the electrical properties such as, for example, the ferromagnetic properties of FRAMs. The service life of RAMs, for example FRAMs or SRAMs, is not limited such that RAMs can be advantageously used in a hermetically encapsulated metering mechanism. Since the RAM is additionally divided into a main memory and an even faster buffer memory, the data in the buffer memory can be made available within the metering unit faster than the data in the main memory and transmitted to the readout unit in a wireless fashion when electrical energy is supplied.

In order to achieve an effective data transmission after the data link has been established, it is advantageously proposed that the data memory of the metering unit initially conditions the data internally or determines the meter reading electrically when electrical energy is available and then sets a selected memory flag after the internal data conditioning has taken place, wherein the data of the metering unit can only be read out if a selected memory flag was set by the readout unit. Due to the very limited time window for the data conditioning and data transmission while the metering unit is briefly supplied with energy by the readout unit, extensive and therefore time-consuming data flow control methods such as, for example, a comprehensive handshake procedure between the metering unit and the readout unit would respectively lead to a faulty or repeated data transmission between the metering unit and the readout unit. According to the present invention, the data is therefore initially conditioned internally when electrical energy is supplied to the metering unit, for example, by electronically determining the current meter reading in the metering mechanism and making the current meter reading available in the data memory. A selected memory flag is not set until this internal data conditioning in the metering unit has been completed, for example, by setting a selected address range in the data memory from "busy" to "ready." Since the electrical energy supply of the readout unit is not problematic, the readout unit accesses the selected address range of the data memory within regular time intervals and does not initiate the data transmission until the memory flag in the form of the status "ready" has been set. The time intervals for the check for the selected memory flag by the readout unit can be freely selected in the readout unit depending on the expected data volumes, the data transmission quality and/or the data transmission rate.

The reduced data flow control according to the present invention also allows an immediate interruption of the wireless energy supply of the metering unit by the readout unit after the successful data transmission such that extensive decoupling procedures between the readout unit and the metering unit are not required. After the electrical energy supply of the metering unit has been interrupted, the selected memory flags are immediately and automatically reset again, for example to "busy," such that an additional data transmission is no longer possible and data in the data memory can no longer be influenced outside the metering unit. The immediate interruption of the electrical energy supply by the reading unit also does not lead to surges in the metering mechanism, particularly in the data memory, such that damages to the metering unit are precluded during this process.

The transmission of the data from the data memory of the metering unit to the readout unit can be advantageously encrypted, particularly by means of established hardware-based or software-based encryption methods such as, for example, a Token or a PIN keypad on the readout unit and/or the meter, with the aid of a digital signature, by means of certificates or a Public-Key encryption. Another advantage is seen in that the readout unit features additional electronic components for determining and adapting the impedance and the resonant frequency of the antenna shape of the metering unit for an optimized transmission of electrical energy from the antenna of the readout unit to the antenna of the metering unit. Due to these measures, the efficiency of the energy transmission from the readout unit to the metering unit can be additionally increased and optimized.

The invention also proposes a method for the determination of meter readings of a hermetically encapsulated meter with an electronic metering mechanism, a metering unit and a data memory for storing the meter readings, wherein the metering unit comprises an antenna with a defined antenna shape. After at least one readout unit, which features an antenna with an antenna shape corresponding to the antenna shape of the metering unit and serves for reading out the meter readings from the data memory, has been arranged outside the hermetically encapsulated electronic metering mechanism, the readout unit is positioned relative to the metering unit and the antenna of the readout unit is arranged congruent with the antenna of the metering unit. As soon as the electrical energy supply of the metering unit is insured, the link between the antenna of the metering unit and the corresponding antenna of the readout unit is established and the wireless transmission of the data from the data memory of the metering unit to the antenna of the readout unit by means of the antenna of the metering unit is initiated.

When electrical energy is available in the metering unit, the data advantageously is initially conditioned in the data memory of the metering unit and a selected memory flag is set after the data conditioning has been carried out, wherein the data of the metering unit can only be read out by the readout unit if the selected memory flag has been set.

An advantage can be seen in that the data is transmitted with a reduced data volume in comparison with a standardized data set such as, for example, a M-Bus Open Metering System and the readout unit allocates the data, which is reduced in comparison with the standardized data set, to the standardized data set by means of an allocator function and thereby completes the standardized data set. The data is advantageously synchronized between a main memory and a buffer memory of the data memory when electrical energy is available, wherein the data is read out from the buffer memory of the metering unit and subsequently transmitted to the readout unit as part of the data transmission between the metering unit and the readout unit.

In an advantageous embodiment of the method, it is proposed that the electrical energy of the electromagnetic radiation emitted by the antenna of the readout unit is initially used for establishing the data link between the antenna of the metering unit and the corresponding antenna of the readout unit, and that the meter reading is simultaneously determined by means of the electronic metering mechanism due to the availability of electrical energy, wherein the data is subsequently conditioned and synchronized between the main memory and the buffer memory of the data memory. The selected memory flag is set after the synchronization of the data between the buffer memory and the main memory has been completed, wherein the readout unit immediately initiates the transmission of the data once the selected memory flag has been detected and immediately interrupts the transmission of electrical energy to the metering unit once the expected data volume has been received. In this way, short turn-on times of the metering unit can on the one hand be observed when it is supplied with electrical energy by the readout unit and a reliable and fast data transmission from the metering unit to the readout unit can on the other hand be ensured.

The invention furthermore proposes a method for the wireless transmission of electrical energy to a hermetically encapsulated meter with an electronic metering mechanism and at least one metering unit by means of electromagnetic radiation, wherein the metering unit comprises an antenna with a defined antenna shape and at least one readout unit is arranged outside the hermetically encapsulated electronic metering mechanism, and wherein the readout unit features an antenna with an antenna shape corresponding to the antenna shape of the antenna of the metering unit. Furthermore, the readout unit is positioned relative to the metering unit and a congruent arrangement between the antenna of the readout unit and the antenna of the metering unit is ensured such that electrical energy in the form of electromagnetic radiation can be transmitted from the antenna of the readout unit to the antenna of the metering unit in a wireless fashion.

DESCRIPTION OF THE DRAWINGS

Other advantageous embodiments can be gathered from the following figures and different exemplary embodiments are described in greater detail below. In these figures:

FIG. 2 shows a schematic top view of the inventive metering mechanism 2 with metering unit 3;

DETAILED DESCRIPTION

Figure 1:
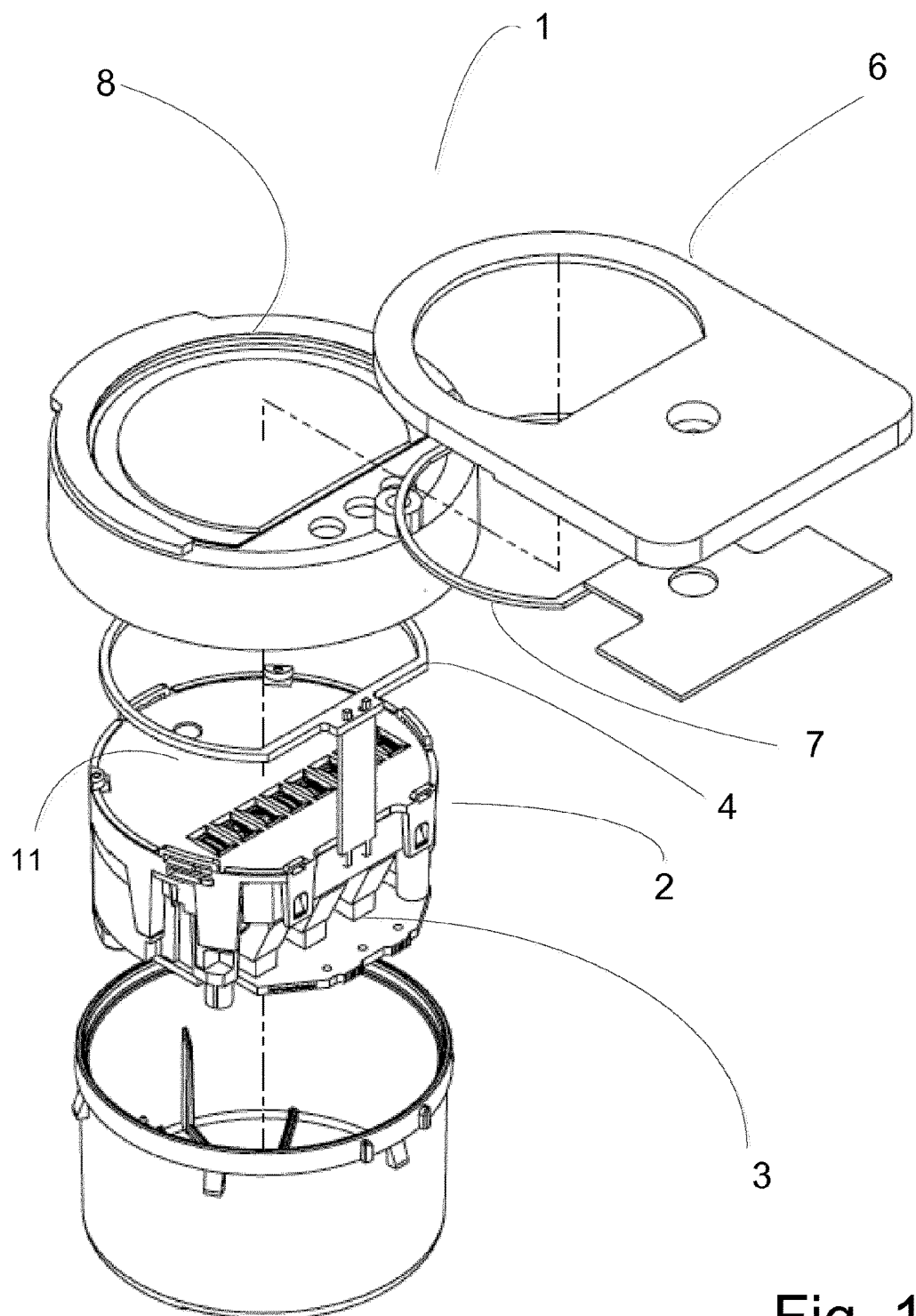
FIG. 1 shows an exploded three-dimensional view of the inventive meter 1.

FIG. 1 shows a perspective sectional drawing of a three-dimensional view of the inventive meter 1 with a hermetically encapsulated electronic metering mechanism 2 and with a metering unit 3 for the determination of meter readings, which is accommodated in the hermetically encapsulated electronic metering mechanism 2. The hermetically encapsulated electronic metering mechanism 2 features a data memory 5 (not illustrated in FIG. 1) for storing the meter readings and the metering unit 3 comprises an antenna 4 with a defined antenna shape, wherein this defined antenna shape is realized in the form of a circle segment in the embodiment of the invention illustrated in FIG. 1. The antenna 4 of the metering unit 3 is integrated within the metering unit 3, preferably embedded in a plastic in the outer region of the metering unit 3. Alternatively, it is also conceivable to arrange an antenna guide channel in a region of the metering unit 3, wherein this antenna guide channel allows autarkic servicing and an exchange of the antenna 4 of the metering unit 3 without having to open the hermetically encapsulated electronic metering mechanism 2.

At least one readout unit 6 for reading out the meter readings from the data memory 5 of the metering unit 3 is arranged outside the hermetically encapsulated electronic metering mechanism 2, preferably on the upper side or underside of the meter 1. The readout unit 6 features an antenna 7 with an antenna shape corresponding to the antenna shape of the antenna 4 of the metering unit 3, wherein the antenna 7 of the readout unit 6 is in the example illustrated in FIG. 1 realized in the form of a circle segment with a shape that is identical to the circle segment shape of the antenna 4 of the metering unit 3. In the embodiment illustrated in FIG. 1, the readout unit 6 serves as a glass mounting for the viewing glass 11 of the meter 1, which is visible from above, and is stationarily and permanently connected to the meter 1. Due to the stationary coupling element 8, which is realized in the form of a plug-type connection in the example illustrated in FIG. 1, the readout unit 6 and the metering unit 3 can be positioned relative to one another in such a way that the antenna 7 of the readout unit 6 and the antenna 4 of the metering unit 3 are arranged congruent with one another. Alternatively, the readout unit 6 may also consist of a handheld readout unit that can be temporarily and nevertheless precisely connected to the meter 1 and therefore to the metering unit 3 by means of a suitable coupling element 8.

The term congruent arrangement refers to a consistent spacing between the antenna 4 of the metering unit 3 and the antenna 7 of the readout unit 6 in a multitude of points thereof. In the example illustrated in FIG. 1, the two antennas 4, 7 are realized in the form of circle segments with essentially identical radii and respectively arranged in planes that extend parallel to one another. In this exemplary arrangement according to FIG. 1, it is important that the effective transmitting surface of the antenna 7 of the readout unit 6 and the effective surface of the antenna 4 of the metering unit 3 are arranged congruently or at least almost congruently in parallel planes and spaced apart from one another by a distance of more than 2 mm. According to the exemplary embodiment illustrated in FIG. 1, the antennas 4 and 7 of the meter 1 are in the installed state arranged such that the antennas 4, 7 lie on top of one another, wherein the antennas 4, 7 overlap one another.

The hermetically encapsulated electronic metering mechanism 2 may be equipped with an additional power source such as, for example, an internal battery, a storage battery and/or a capacitor such that only a data link 12 and a data transmission 13 (FIG. 4) are realized between the antenna 4 of the metering unit 3 and the corresponding and congruently arranged antenna 7 of the readout unit 6. In the context of the present invention, the antennas 4, 7 can also be used exclusively for realizing a wireless electrical energy supply from the readout unit 6 to the metering unit 3 by means of electromagnetic radiation. In this case, the data link 12 and the data transmission 13 are realized with other external data processing devices such as, for example, a data cable between the metering unit and an external data processing device. However, the simultaneous utilization of the antenna 7 of the readout unit 6 and the antenna 4 of the metering unit 3 for the wireless electrical energy supply and the wireless data link 12 and data transmission 13 is also an essential characteristic of the present invention.

According to FIG. 1, the antenna 4 of the metering unit 3 on the one hand and the antenna 7 of the readout unit 6 on the other hand are respectively formed by a closed annular body. This figure shows that the respective antennas 4, 7 are realized in the form of identical circle segments comprising a circular arc section and a chord section.

Since only a corresponding antenna shape of the respective antennas 4, 7 and their congruent arrangement have to be ensured and the metering unit 3 and the readout unit 6 can therefore be designed for even the smallest structural sizes, meters 1 that are already in operation can be easily replaced or retrofitted with the metering unit 3 and/or the readout unit 6. The readout unit 6 may be connected to other processing devices and/or wireless or cable-bound networks that allow the additional processing of the data of the metering unit 3.

FIG. 2 shows a schematic top view of the hermetically encapsulated electronic metering mechanism 2 with metering unit 3 according to the invention. In FIG. 2, the viewing glass 11 is drawn with a continuous line and the antenna 4 of the metering unit 3 arranged underneath the viewing glass 11 is drawn with a broken line because it lies lower. The antenna 4 is directly connected to the metering unit 3, which is likewise arranged underneath the viewing glass 11, in the form of an electronic circuit and therefore makes it possible to realize fast data conditioning 14, as well as a data link 12 and data transmission 13 to the readout unit 6 (not illustrated in FIG. 2). An effective wireless energy transmission from the readout unit 6 to the metering unit can be simultaneously or alternatively realized. Due to the utilization of an additional viewing glass 11, a direct visual readout of the meter readings is still possible, namely even if a complete electrical failure of the metering mechanism 2 or the readout unit 6 occurs, such that the meter 1 would not have to be immediately replaced in case of an electrical system failure.

Figure 3A:
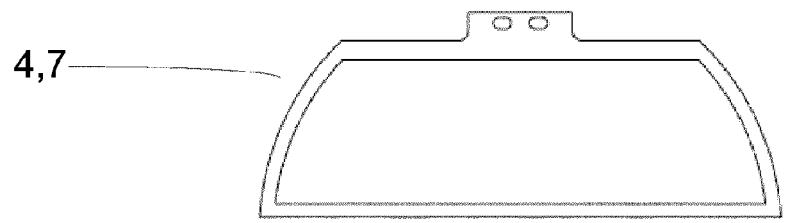
FIGS. 3a, 3b, 3c respectively show a top view of different antenna shapes for the antenna 4 of the metering unit 3 and the antenna 7 of the readout unit 6.
Figure 3B:
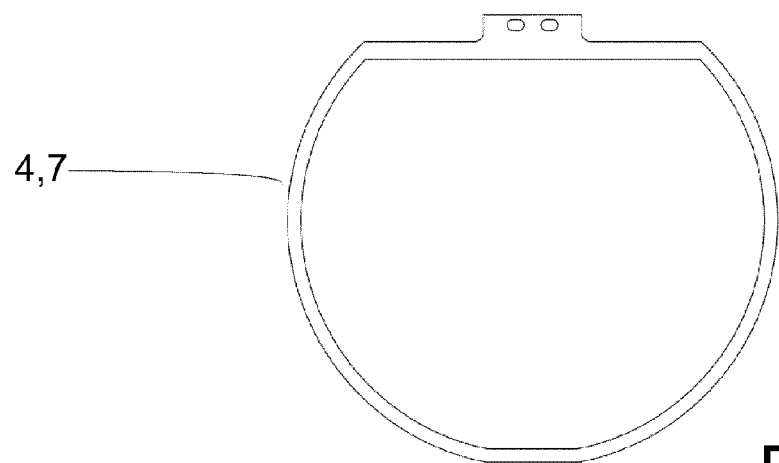
Figure 3C:
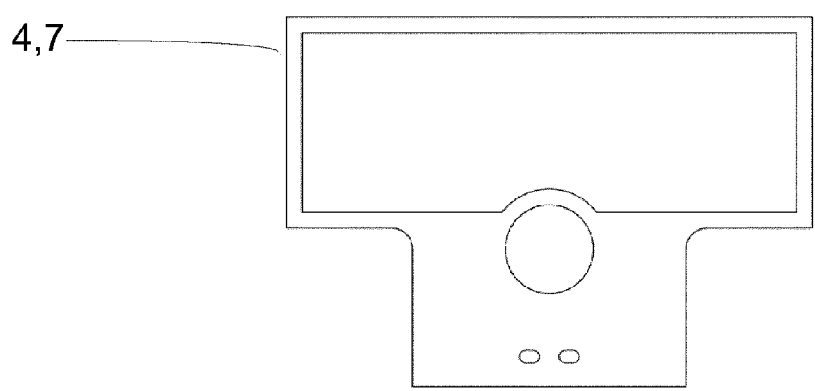

Different antenna shapes of the antennas 4, 7, examples of which are illustrated in FIGS. 3a, 3b and 3c, may be used for the data communication between the metering unit 3 and the readout unit 6 and/or for the energy transmission from the readout unit 6 to the metering unit 3 in dependence on the structural circumstances for the meter 1 at the supply lines, the required or specified sizes and shapes of the metering unit 3 and the readout unit 6 or the connecting options for the respective antenna 4, 7 within the metering unit 3 or the readout unit 6.

Figure 4:
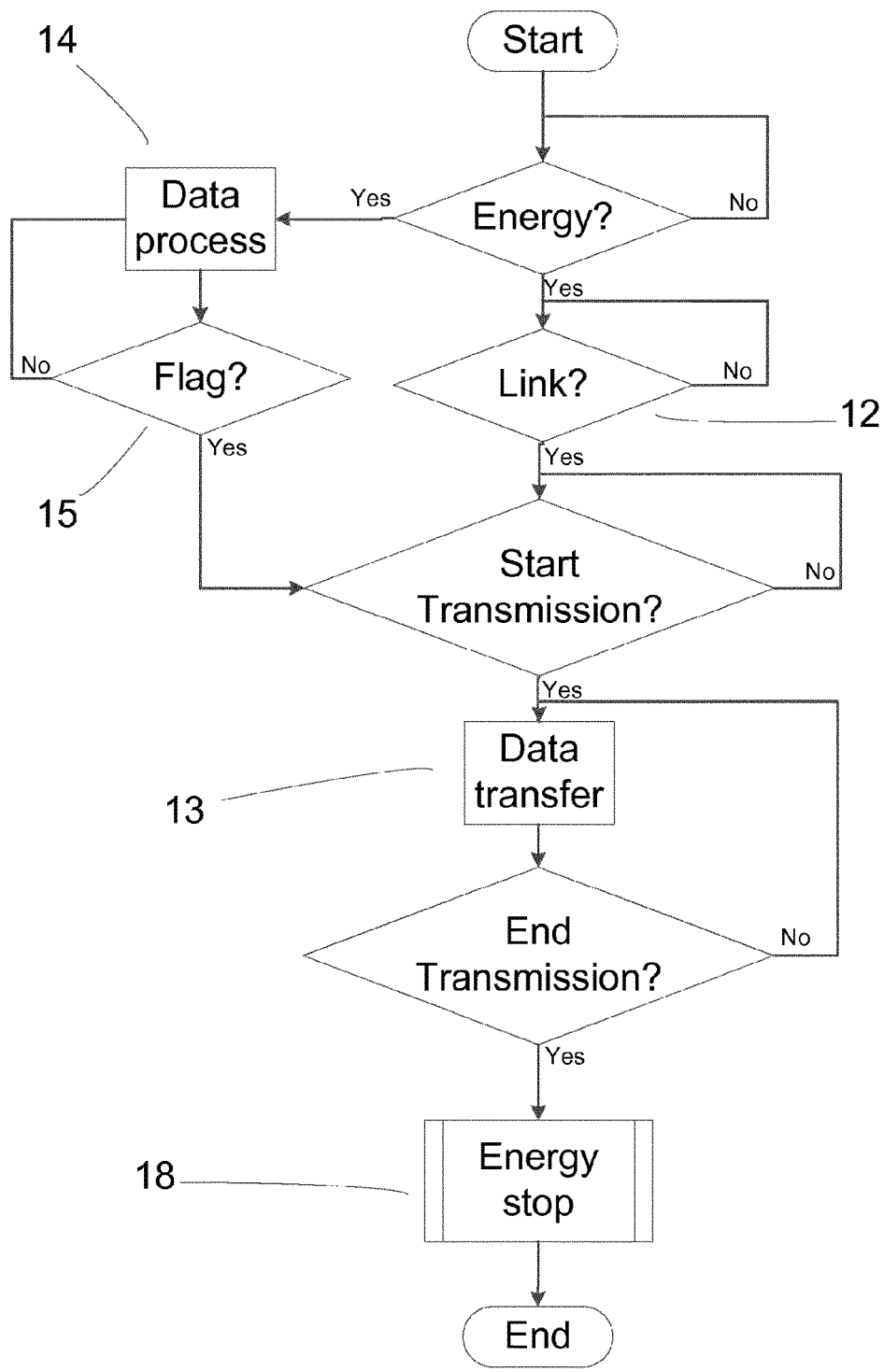
FIG. 4 shows a flowchart for the determination of meter readings by the metering unit 3.

FIG. 4 shows a schematic flow chart for the determination of meter readings in the metering unit 3. If the metering unit (not illustrated in FIG. 4) is connected to a permanent electrical power supply, the metering unit 3 can actively monitor the presence of an electrical energy supply and, if applicable, also actively carry out the data conditioning 14 and initiate or monitor the data link 12 with the readout unit 6 (not illustrated in FIG. 4). If the metering unit 3 is not connected to an independent electrical energy supply and requires a wireless energy supply from the readout unit 6, a data link 12 between the metering unit 3 and the readout unit 6 can only be initiated if the briefly available electrical energy within the metering unit 3 was previously or simultaneously used for the data conditioning 14. Once the data conditioning 14 is completed, the selected memory flag 15 is set and the data transmission 13 between the metering unit 3 and the readout unit 6 is started if a data link 12 has been established. After the readout unit 6 has completely received all data, the electrical energy supply 18 from the readout unit 6 can be immediately interrupted such that the metering unit 3 is immediately deactivated and the data link 12 is separated. In the de-energized state, the selected memory flag is automatically set to "busy" such that an additional data transmission 13 is no longer possible and data can no longer be influenced outside the metering unit 3. If the metering unit 3 is connected to a permanent power supply, a coordinated decoupling process between the metering unit 3 and the readout unit 6 can alternatively be carried out, wherein the metering unit 3 subsequently puts itself into a low-consumption mode.

Figure 5:
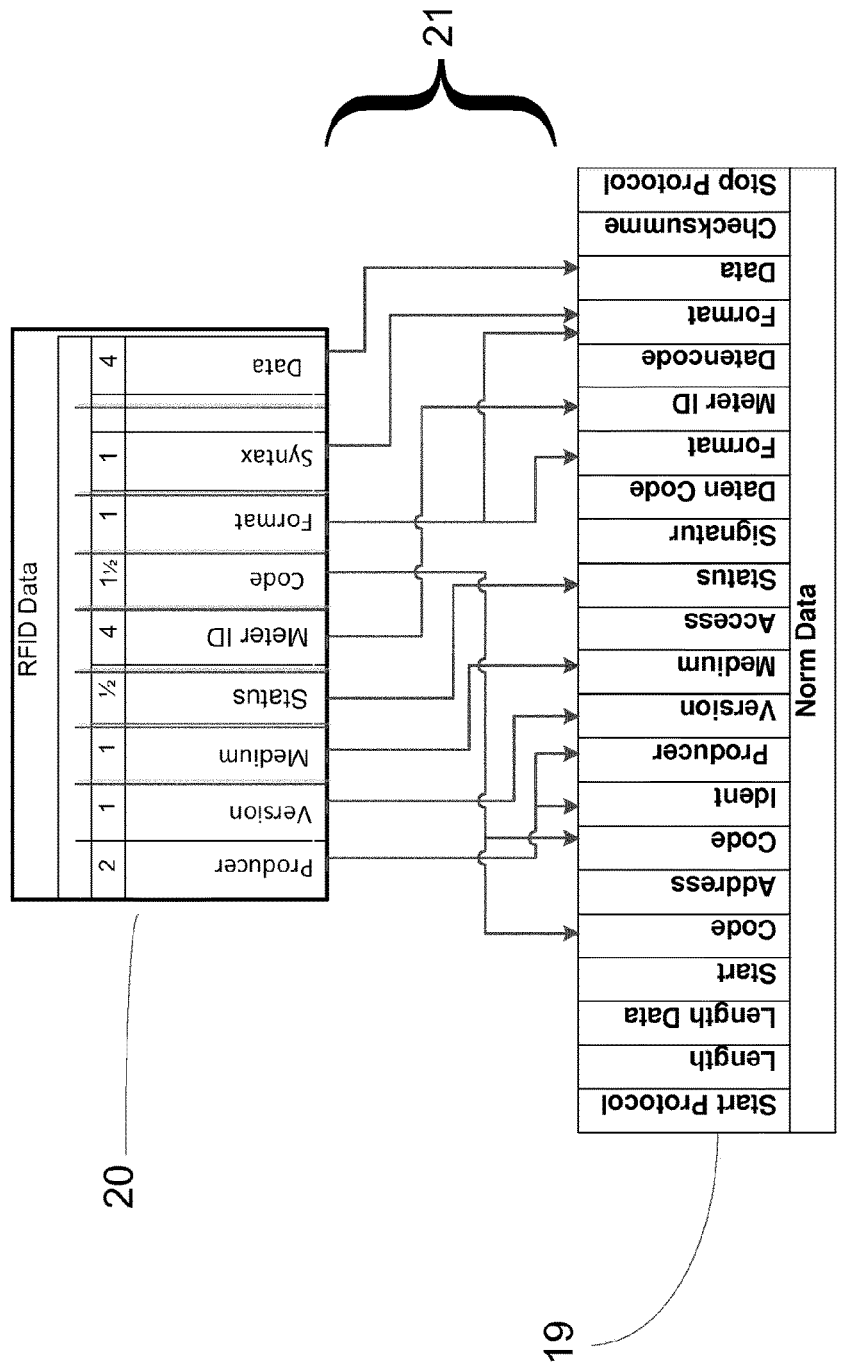
FIG. 5 shows a general drawing of the allocator function 21 with respect to the reduced data set 20 being transmitted and the standardized data set 19 according to the specifications of the relevant technical norm.

FIG. 5 shows a general drawing of the allocator function 21 with respect to the reduced data set 20 being transmitted and the standardized data set 19 according to the specifications of the relevant technical norm or standard. In the context of the present invention, it is advantageous that only the absolutely necessary data is transmitted from the metering unit 3 (not illustrated in FIG. 5) to the readout unit 6 (not illustrated in FIG. 5) in a reduced data volume 20. This data includes the data determined at runtime such as meter reading and status. The data associated with the meter such as meter ID, unit, decimal places of the meter reading, medium or producer and other norm-dependent or standard-dependent information are likewise required. The readout unit 6 receives the standardized data set 19, which is based on the respectively relevant technical norm or standard, and allocates the data of the reduced data volume 20 to the standardized data set 19 by means of a predefined allocator function 21. In this case, the allocator function 21 may be permanently implemented in the readout unit 6 and, if applicable, also contain additional data and information required for the allocation or for the completion of the standardized data set 19 with the reduced data volume 20. In a permanent relative arrangement between the metering unit 3 and the readout unit 6, for example, it is possible to forgo the transmission of stationary data such as, for example, the identification number or the producer of the meter 1 (not illustrated in FIG. 5) because this data does not change and is always allocated to the respective meter 1. The readout unit 6 can additionally or alternatively determine the reduced data volume 20 dynamically, possibly in connection with other data processing devices and networks, as well as dynamically generate the allocator function 21 by means of external databases, in order to thereby complete the reduced data volume 20 with respect to the standardized data set 19.

In the example illustrated in FIG. 5, the data of the reduced data volume 20 is altogether transmitted with only 16 bytes and adapted to the much more extensive protocol of the standardized data set 19 of the technical standard such as, for example, the standard transmission protocol of the M-Bus Open Metering System.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:
1. A meter comprising:
a hermetically encapsulated electronic metering mechanism with a metering unit for determining meter readings, wherein the metering mechanism includes a data memory for storing the meter readings;
the metering unit including an antenna having a predefined antenna shape;

a readout unit for reading out the meter readings from the data memory arranged outside the metering mechanism;

the readout unit having an antenna with the predefined antenna shape corresponding to the antenna of the metering unit; and wherein the readout unit and the metering unit are positioned relative to one another whereby the antenna of the readout unit and the antenna of the metering unit are arranged congruent with one another, and wherein electrical energy of electromagnetic radiation emitted by the antenna of the readout unit is initially used for establishing a data link between the antenna of the metering unit and the antenna of the readout unit, and wherein one of the meter readings is simultaneously determined by the metering mechanism due to the availability of the electrical energy, and wherein data is subsequently conditioned and synchronized between a main memory and a buffer memory of the data memory, and wherein a selected memory flag is set after the synchronization of the data between the buffer memory and the main memory has been completed, and wherein the readout unit is configured to initiate the transmission of the data once the selected memory flag is detected and is configured to immediately interrupt the transmission of electrical energy to the metering unit once an expected data volume has been received.

2. The meter according to claim 1 wherein the congruently arranged antennas of the metering unit and the readout unit are positioned in the meter to lie on top of one another, wherein the antennas overlap one another.

3. The meter according to claim 1 wherein the antenna of the readout unit and the antenna of the metering unit are each formed as a closed annular body.

4. The meter according to claim 1 wherein electrical energy is transmitted from the readout unit to the metering unit wirelessly by transmitting the electrical energy from the antenna of the readout unit to the antenna of the metering unit as electromagnetic radiation.

5. The meter according to claim 1 wherein the predefined antenna shape is sectionally circular with a curvature radius in a form of a circle segment.

6. The meter according to claim 1 wherein the antenna of the readout unit is arranged within the readout unit and the antenna of the metering unit is arranged within the metering unit, and the readout unit and the metering unit are positioned relative to one another by a coupling element.

7. The meter according to claim 1 wherein data including the meter readings is transmitted from the data memory of the metering unit to the readout unit through the data link between the antenna of the metering unit and the antenna of the readout unit established as at least one of a capacitive coupling and an inductive coupling.

8. The meter according to claim 1 wherein data including the meter readings is transmitted from the data memory of the metering unit to the readout unit digitally and with a reduced data volume in comparison with a standardized data set.

9. The meter according to claim 8 wherein the readout unit allocates the reduced data volume by an allocator function.

10. The meter according to claim 1 wherein the data within the buffer memory is read out and transmitted as part of data transmission between the metering unit and the readout unit.

11. The meter according to claim 1 wherein the readout unit can only read out data from the metering unit if the selected memory flag is set.

12. The meter according to claim 1 wherein transmission of data from the data memory of the metering unit to the readout unit is encrypted.

13. The meter according to claim 1 wherein the readout unit determines and adapts an impedance and a resonant frequency of the antenna of the metering unit for an optimized transmission of electrical energy from the antenna of the readout unit to the antenna of the metering unit.

14. A method for determining meter readings of a meter having a hermetically encapsulated electronic metering mechanism, a metering unit and a data memory for storing the meter readings, wherein the metering unit has an antenna with a predefined antenna shape, and wherein the method comprises the steps of:

arranging a readout unit for reading out the meter readings from the data memory outside the metering mechanism, wherein the readout unit has an antenna with the predefined antenna shape;

positioning the readout unit relative to the metering unit and arranging the antenna of the readout unit congruent with the antenna of the metering unit; and establishing a data link between the antenna of the metering unit and the antenna of the readout unit and transmitting data including the meter readings from the data memory of the metering unit to the antenna of the readout unit wirelessly by the antenna of the metering unit, wherein electrical enemy of electromagnetic radiation emitted by the antenna of the readout unit is initially used for establishing the data link between the antenna of the metering unit and the antenna of the readout unit, wherein a one of the meter readings is simultaneously determined by the metering mechanism due to the availability of the electrical energy, wherein data is subsequently conditioned and synchronized between a main memory and a buffer memory of the data memory, wherein a selected memory flag is set after the synchronization of the data between the buffer memory and the main memory has been completed, and wherein the readout unit immediately initiates the transmission of the data once the selected memory flag is detected and immediately interrupts the transmission of electrical energy to the metering unit once an expected data volume has been received.

15. The method according to claim 14 including initially conditioning the data in the data memory of the metering unit when electrical energy is available, and setting the selected memory flag after the data conditioning has been carried out, wherein the readout unit can only read out the data of the metering unit if the selected memory flag is set.

16. The method according to claim 14 including transmitting the data with a reduced data volume in comparison with a standardized data set, and wherein the readout unit allocates the reduced data volume using an allocator function.

17. The method according to claim 14 wherein the data is read out from the buffer memory and subsequently transmitted to the readout unit as part of the data transmission between the metering unit and the readout unit.

18. A method for wireless transmission of electrical energy to a meter by electromagnetic radiation, the meter including a hermetically encapsulated electronic metering mechanism and a metering unit having an antenna with a predefined antenna shape, the method comprising the steps of:

arranging a readout unit outside of the metering mechanism, wherein the readout unit includes an antenna with the predefined antenna shape;

positioning the readout unit relative to the metering unit and arranging the antenna of the readout unit congruent with the antenna of the metering unit; and transmitting electrical energy as electromagnetic radiation wirelessly from the antenna of the readout unit to the antenna of the metering unit to wirelessly supply the electrical energy to the metering unit, wherein electrical energy of electromagnetic radiation emitted by the antenna of the readout unit is initially used for establishing a data link between the antenna of the metering unit and the antenna of the readout unit, and wherein a reading is simultaneously determined by the metering mechanism due to the availability of the electrical energy, and wherein data is subsequently conditioned and synchronized between a main memory and a buffer memory, and wherein a selected memory flag is set after the synchronization of the data between the buffer memory and the main memory has been completed, and wherein the readout unit immediately initiates the transmission of the data once the selected memory flag is detected and immediately interrupts the transmission of electrical energy to the metering unit once an expected data volume has been received.

* * * * *